United States Patent
Tsumura et al.

(10) Patent No.: US 8,737,719 B2
(45) Date of Patent: May 27, 2014

(54) ALIGNMENT UNIT CONTROL APPARATUS AND ALIGNMENT METHOD

(75) Inventors: Yoichiro Tsumura, Hiroshima (JP); Takanori Inaba, Kanagawa (JP)

(73) Assignees: Mitsubishi Heavy Industries, Ltd., Tokyo (JP); Fast Corporation, Kanagawa (JP)

( * ) Notice: Subject to any disclaimer, the term of this patent is extended or adjusted under 35 U.S.C. 154(b) by 613 days.

(21) Appl. No.: 13/056,566

(22) PCT Filed: Oct. 28, 2009

(86) PCT No.: PCT/JP2009/068486
§ 371 (c)(1),
(2), (4) Date: Feb. 17, 2011

(87) PCT Pub. No.: WO2010/050500
PCT Pub. Date: May 6, 2010

(65) Prior Publication Data
US 2011/0134235 A1 Jun. 9, 2011

(30) Foreign Application Priority Data
Oct. 30, 2008 (JP) .................. 2008-279262

(51) Int. Cl.
*G06K 9/00* (2006.01)
(52) U.S. Cl.
USPC ........................................... 382/151
(58) Field of Classification Search
None
See application file for complete search history.

(56) References Cited

U.S. PATENT DOCUMENTS

| | | | |
|---|---|---|---|
| 4,450,579 A * | 5/1984 | Nakashima et al. | 382/151 |
| 4,688,088 A * | 8/1987 | Hamazaki et al. | 348/94 |
| 6,215,897 B1 * | 4/2001 | Beer et al. | 382/151 |
| 8,013,621 B2 * | 9/2011 | Sano et al. | 324/750.23 |
| 8,133,418 B2 * | 3/2012 | Ando et al. | 264/40.1 |
| 8,285,028 B2 * | 10/2012 | Iwahashi et al. | 382/141 |
| 2002/0122584 A1 * | 9/2002 | Sugawara | 382/151 |
| 2002/0131632 A1 * | 9/2002 | Vernackt | 382/151 |

(Continued)

FOREIGN PATENT DOCUMENTS

| | | |
|---|---|---|
| JP | 2001-313383 A | 11/2001 |
| JP | 2002-162206 A | 6/2002 |

(Continued)

OTHER PUBLICATIONS

Japanese Decision to Grant a Patent in corresponding Application No. 2008-279262 mailed Jul. 16, 2013 with English translation.

*Primary Examiner* — John Strege
*Assistant Examiner* — Sean Conner
(74) *Attorney, Agent, or Firm* — Birch, Stewart, Kolasch & Birch, LLP

(57) ABSTRACT

An alignment unit control apparatus according to the present invention includes: an imaging section configured to control cameras to image a plurality of regions on a surface of a substrate to generate a plurality of images; a region detecting section configured to select a detection region from the plurality of regions based on the plurality of images; and an aligning section configured to align the substrate based on an alignment image obtained by imaging a mark of the substrate in the detection region by one of the plurality of cameras. For this reason, the alignment unit control apparatus does not need to have another mechanism for the purpose of positioning the mark for alignment in the field of vision of the camera, and can more easily be manufactured, and a region of an alignment mark can be detected more easily.

14 Claims, 6 Drawing Sheets

(56) References Cited

U.S. PATENT DOCUMENTS

| | | |
|---|---|---|
| 2003/0092244 A1 | 5/2003 | Ol et al. |
| 2003/0235330 A1* | 12/2003 | Tanaka .......................... 382/151 |
| 2004/0042648 A1* | 3/2004 | Yoshidda et al. ............. 382/151 |
| 2005/0053273 A1* | 3/2005 | Ostrom et al. ................ 382/151 |
| 2005/0220334 A1* | 10/2005 | Tanaka .......................... 382/151 |
| 2005/0249396 A1* | 11/2005 | Cerrina et al. ................ 382/151 |
| 2006/0078192 A1* | 4/2006 | Oh et al. ....................... 382/151 |
| 2010/0195897 A1* | 8/2010 | Kameda et al. ............... 382/151 |

FOREIGN PATENT DOCUMENTS

| | | |
|---|---|---|
| JP | 2002-516238 A | 6/2002 |
| JP | 3356406 A | 12/2002 |
| JP | 2003-142534 A | 5/2003 |
| JP | 2003-218133 A | 7/2003 |
| JP | 2004-207436 A | 7/2004 |
| JP | 2005-229006 A | 8/2005 |
| JP | 2008-139202 A | 6/2008 |
| JP | 2009-231671 A | 10/2009 |

* cited by examiner

ALIGNMENT UNIT CONTROL APPARATUS AND ALIGNMENT METHOD

TECHNICAL FIELD

The present invention relates to an alignment unit control apparatus and an alignment method, and particularly, relates to an alignment unit control apparatus and an alignment method, which are used for alignment of substrates.

BACKGROUND ART

A MEMS is known in which minute electrical parts and machine parts are integrated. The MEMS is exemplified by a micro-machine, a pressure sensor, and a micro-motor. The MEMS is manufactured by bonding semiconductor substrates such that a plurality of patterns are laminated. The semiconductor substrates require alignment in a horizontal direction when pressure welding in a vertical direction is performed.

An alignment unit is known which aligns the patterns at the time of bonding. The alignment apparatus is desired to have a smaller scale since the alignment unit is positioned in a vacuum atmosphere in which room temperature bonding is performed.

Japanese Patent 3,356,406 discloses a misalignment detecting apparatus which can detect positions of alignment marks without positioning an optical system between works to accurately detect misalignment of the works. The misalignment detecting apparatus detects the misalignment in an XY-plane between a plurality of works positioned in a z-axis direction with predetermined clearances, based on positions on the XY-plane of alignment marks formed on the opposing surfaces. A plurality of infrared imaging units are provided in accordance with the number of alignment marks to coaxially image the works from one direction through a common optical axis orthogonal to the XY-plane. The focused regions of the infrared imaging units are set in positions so that the alignment marks can be imaged, respectively.

Japanese Patent Publication (JP 2003-142534A) discloses an alignment method which makes it possible to align with high precision. In the alignment method, a recognition mark of a first bonding object having an alignment reference as an alignment recognition mark on the upper surface or in the inside, and a recognition mark of a second bonding object positioned below are aligned with high precision. In this alignment method, the first bonding object provided with the alignment recognition mark on the upper side or in the inside, and the second bonding object positioned below and provided with a recognition mark for the alignment with the first bonding object, are aligned by using a recognition section with two fields of vision put between the both objects. The conventional example is characterized in that the recognition mark on the upper side or in the inside of the first bonding object is recognized with an electromagnetic wave or a sound wave which can transmit through the first bonding object.

Japanese Patent Publication (JP-P2002-162206A) discloses an alignment method which makes it possible to adjust relative positions between bonding objects within permissible precision surely and easily, when alignment is performed for bonding the bonding objects and when one bonding object has covering material. In the alignment method, when a first bonding object and a second bonding object having the covering material are relatively aligned, a recognition section recognizes a position of an alignment mark of the first bonding object. A reference mark representing a position of the first bonding object is displayed on a screen at a position which corresponds to an outside region of the covering material of the second bonding object based on the recognition position, and the recognition section recognizes a position of an alignment mark of the second bonding object put on the outside of the covering material of the second bonding object. The recognition position is displayed on the screen, and a position of the second bonding object is corrected so that a position of the alignment mark of the second bonding object is within the predetermined permissible precision with respect to a position of the reference mark.

Japanese Patent Publication (JP P2003-218133A) discloses an alignment method in which it becomes possible to align bonding objects efficiently with high precision in a short time. In the alignment method, a first bonding object is aligned with a second bonding object. A first alignment is performed with respect to a rotation direction θ of the bonding object by recognizing at least two first recognition marks provided apart from at least one bonding object by a recognition section. A second alignment is performed with respect to parallel movement directions X and Y of the bonding object by recognizing a second recognition mark provided on at least one bonding object, by the recognition section.

Japanese Patent Publication (JP P2004-207436A) discloses a method in which makes it possible to perform pre-alignment of an orientation flat and wafer bonding with high precision without causing misalignment in a series of processes. In the wafer pre-alignment method, both edges facing each other of a chucked wafer are chucked with a wafer guide on a rotary table having a chuck mechanism and a rotation mechanism. A position of an orientation flat surface of the wafer is measured with an angle detecting section, and a wafer rotation angle is calculated. The orientation flat surface of the wafer is rotated to a predetermined angle calculated by the angle detecting section through rotation of the rotary table. Rotation to a pre-alignment position and alignment are performed after rotation to a reference position and alignment.

CITATION LIST

[Patent Literature 1]: Japanese Patent 3356406
[Patent Literature 2]: JP P2003-142534A
[Patent Literature 3]: JP P2002-162206A
[Patent Literature 4]: JP P2003-218133A
[Patent Literature 5]: JP P2004-207436A

SUMMARY OF THE INVENTION

An object of the present invention is to provide an alignment unit control apparatus which can be manufactured more easily.

Another object of the present invention is to provide an alignment method performed by using a smaller-scale alignment unit control apparatus.

Still another object of the present invention is to provide an alignment unit control apparatus and an alignment method for aligning substrates in a shorter time.

Yet still another object of the present invention is to provide an alignment unit control apparatus and an alignment method for aligning substrates more surely.

It is an object of the present invention is to provide an alignment unit control apparatus and an alignment method for aligning substrates more precisely.

An alignment unit control apparatus according to the present invention has an imaging section configured to control cameras to image a plurality of regions on a surface of a substrate to generate a plurality of images, a region detecting section configured to select a detection region from the plurality of regions based on the plurality of images, and an aligning section configured to align the substrate based on an alignment image obtained by imaging a mark of said substrate in the detection region by one of said plurality of cameras. That is to say, even when the mark is not within the imaging region of the camera used for alignment of the substrate, the alignment unit control apparatus can control a position relation between the camera and the substrate so that the mark on the substrate is in the field of vision of the camera by using the camera. For this reason, the alignment unit control apparatus does not need to have another mechanism for the purpose of positioning the mark for alignment in the field of vision of the camera, and can more easily be manufactured.

It is preferable that when a first image of the plurality of images and a second image of the plurality of images are different from each other, the region detecting section selects the detection region from a first region shown by the first image of the plurality of regions and a second region shown by the second image of the plurality of regions.

The alignment unit control apparatus according to the present invention further includes a brightness summation distribution calculating section configured to calculate a plurality of brightness summation distributions based on the plurality of images. One of the plurality of brightness summation distributions calculated based on one of the plurality of images shows a distribution of brightness summations obtained when the image is projected in a projection direction. The region detecting section selects the detection region from the first region and the second region when a first brightness summation distribution calculated based on the first image among the plurality of brightness summation distributions and a second brightness summation distribution calculated based on the second image among the plurality of brightness summation distributions are different from each other. Such selection of the detection region can be performed faster with a smaller amount of calculation, compared with a case where the first image and the second image are just compared.

The alignment unit control apparatus according to the present invention further includes a ratio change calculating section configured to calculate a ratio change based on the first brightness summation distribution and the second brightness summation distribution. The ratio change shows a ratio as the result of dividing a brightness summation of the first brightness summation distribution at each of positions by a brightness summation at the position of the second brightness summation distribution. When the ratio change has a value which is out of a predetermined range, the region detecting section selects the detection region from a first region and a second region. Such selection of the detection region can prevent a malfunction due to brightness of a background image.

The brightness summation distribution can further include another distribution of brightness summations in which the image is projected in another projection direction different from the above projection direction. Such selection of the detection region makes it possible to more surely detect the detection region where the mark is shown, compared with a case where only a projected brightness projected in the projection direction is used.

The alignment unit control apparatus according to the present invention may further include a ratio change calculating section configured to calculate a first ratio change and a second ratio change based on the first brightness summation distribution and the second brightness summation distribution. The first ratio change shows a ratio change as the result of dividing a brightness summation at each of positions of a brightness summation distribution obtained through projection in the projection direction of the first brightness summation distribution, by a brightness summation at the position of a brightness summation distribution obtained through projection in the projection direction of the second brightness summation distribution. The second ratio change shows a ratio change as the result of dividing a brightness summation at each of positions of a brightness summation distribution obtained through projection in the other projection direction of the first brightness summation distribution, by a brightness summation at the position of a brightness summation distribution obtained projection in the other projection direction of the second brightness summation distribution. At this time, the detection region is selected from the first region and the second region when the first ratio change and the second ratio change includes a value which is out of a predetermined range. Such selection of the detection region makes it possible to more surely detect the detection region in which the mark is shown, compared with a case where only ratio change relevant to the projection direction is used.

The alignment unit control apparatus according to the present invention further includes a focusing section configured to control the camera to focus based on an image of the detection region. At this time, it is preferable that the alignment image should be imaged after focusing.

When the alignment image of the mark is different from a predetermined image, the region detecting section selects another detection region different from the detection region, from the plurality of regions based on the plurality of images. At this time, the aligning section aligns the substrate based on the alignment image showing the mark shown in another detection region. At this time, the alignment unit control apparatus can detect the alignment mark more precisely and aligns the substrate more surely.

It is preferable that a path which follows the plurality of regions in order of imaging of the plurality of regions, should form a spiral.

A width of an overlapping region of two regions adjacent to each other in one direction among the plurality of regions is larger than a half of a width of the mark in the direction shown on a surface. At this time, more than a half of the mark shown on the surface is imaged more surely, and an imaging region on which the mark is shown can be detected more surely.

An alignment method according to the present invention includes: imaging a plurality of regions of a surface of a substrate by using cameras as a plurality of images, selecting a detection region from the plurality of regions based on the plurality of images, and aligning the substrate based on an alignment image of a mark which is imaged by one of the cameras in the detection region. That is to say, even when the mark is not in the imaging region of the camera used when the substrate is aligned, the alignment method according to the present invention makes it possible to control a position relation between the camera and the substrate so that the mark on the substrate is in the field of vision of the camera. For this reason, the alignment method of the present invention does not need to use another mechanism for positioning the mark used for alignment in the field of vision of the camera.

When a first image of the plurality of images and a second image of the plurality of images are different from each other, the detection region is selected from a first region shown by the first image among the plurality of regions and a second region shown by the second image among the plurality of regions.

The alignment method of the present invention further includes calculating each of a plurality of brightness summation distributions based on the plurality of images. A brightness summation distribution calculated based on the image among the plurality of brightness summation distributions shows a distribution of brightness summations in which the image is projected in one projection direction. When a first brightness summation distribution calculated based on a first image among the plurality of brightness summation distributions and a second brightness summation distribution calculated based on a second image among the plurality of brightness summation distributions are different from each other, the detection region is selected from a first region and a second region. Such selection of the detection region can be performed faster with a smaller amount of calculation, compared with a case where the first image and the second image are just compared.

The alignment method of the present invention further includes calculating ratio change based on the first brightness summation distribution and the second brightness summation distribution. The ratio change shows a ratio change as the result of dividing a brightness summation at each of positions, of the first brightness summation distribution, by a brightness summation at the position of the second brightness summation distribution. When the ratio change includes a value which is out of a predetermined range, the detection region is selected from a first region and a second region. Such selection of the detection region can prevent a malfunction due to brightness of a background image.

The brightness summation distribution can further show another distribution of brightness summations when the image is projected in another projection direction different from the above projection direction. Such selection of the detection region makes it possible to more surely detect the detection region in which the mark is shown, compared with a case where a single projected brightness projected in a single projection direction is used.

The alignment method of the present invention may further include calculating a first ratio change and a second ratio change based on the first brightness summation distribution and the second brightness summation distribution. The first ratio change shows a ratio change as the result of dividing a brightness summation at each of positions of a brightness summation distribution obtained through projection in the projection direction of the first brightness summation distribution, by a brightness summation at the position of a brightness summation distribution obtained through projection in the single projection direction of the second brightness summation distribution. The second ratio change shows a ratio change as the result of dividing a brightness summation at each of positions of a brightness summation distribution obtained through projection in another projection direction of the first brightness summation distribution, by a brightness summation at the position of a brightness summation distribution obtained through projection in another direction of the second brightness summation distribution. At this time, the detection region is selected from the first region and the second region when the first ratio change or the second ratio change has a value which is out of a predetermined range. Such selection of the detection region makes it possible to more surely detect the detection region on which the mark is shown, compared with a case where only ratio change relevant to the projection direction is used.

It is preferable that the alignment method of the present invention should further have a step of imaging an image for alignment after focusing the camera based on the image which shows a detection region.

The alignment method of the present invention further includes selecting another detection region different from the detection region from the plurality of regions based on the plurality of images when the alignment image of the mark is different from a predetermined mark, and aligning the substrate based on the alignment image of the mark in the other detection region. At this time, the alignment method of the present invention can more precisely detect the alignment mark and more surely align the substrate.

It is preferable that a path which follows the plurality of regions in order of imaging of the plurality of regions forms a spiral.

A width of an overlapping region of two regions adjacent to each other in one direction among the plurality of regions is larger than a half of a width of the mark in the direction. At this time, more than the half of the mark is imaged more surely, and the imaging region in which the mark is shown can be detected more surely.

Even when the mark is not in the imaging region of the camera used for alignment of the substrate, the alignment unit control apparatus and the alignment method of the present invention make it possible to bring the mark on the substrate into the field of vision of the camera. For this reason, the alignment unit for alignment of the substrate does not need to include a mechanism for more surely positioning the alignment mark in a field of vision of a camera, and can be manufactured more easily.

DESCRIPTION OF EMBODIMENTS

Figure 1:
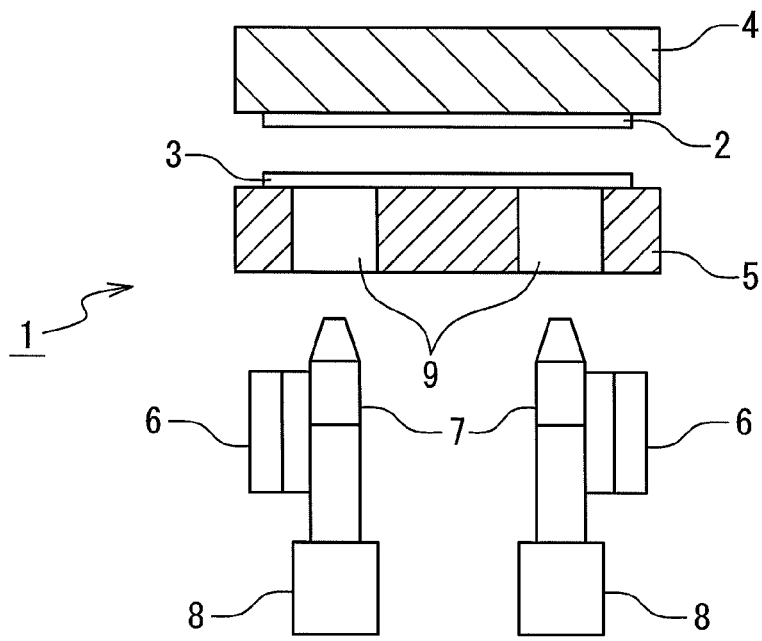
FIG. 1 is a side cross sectional view showing an alignment unit according to an embodiment of the present invention.

Hereinafter, an alignment unit according to the present invention will be described with reference to the attached drawings. As shown in FIG. 1, the alignment unit 1 is applied to a room-temperature bonding apparatus used when a product is manufactured by bonding a semiconductor substrate 3 and a semiconductor substrate 2 through room-temperature bonding. The room-temperature bonding apparatus includes an upper stage 4, a wafer moving stage 5, focusing stages 6, lenses 7, and cameras 8. The upper stage 4 and the wafer moving stage 5 are located in a chamber of a vacuum atmosphere. The focusing stages 6, the lenses 7, and the cameras 8 are positioned on the side of the atmosphere through an observation window provided to the chamber.

The upper stage 4 is supported by the chamber movably in parallel to a vertical direction. The upper stage 4 is provided with an electrostatic chuck on the lower side along a vertical axis, and supports a semiconductor substrate with electrostatic force. The wafer moving stage 5 is supported by the chamber movably in parallel along a horizontal direction and rotatably around a rotational axis parallel to the vertical axis. The wafer moving stage 5 is provided with an electrostatic chuck on the upper side along the vertical axis, and supports the semiconductor substrate 3 with electrostatic force. The wafer moving stage 5 has transparent portions 9. The transparent portions 9 are made of material which is transparent for visible light and light of a wavelength band corresponding to sensitivity of the cameras 8, and positioned at a part of the wafer moving stage 5 on which the semiconductor substrate 3 is located.

The focusing stages 6 are supported by the chamber and support the lenses 7 movably in parallel to the vertical axis. Light reflected by the semiconductor substrate 2 or the semiconductor substrate 3, and transmitting the transparent portion 9, reaches the camera 8 through the lens 7. Additionally, the lens 7 also has a function of lighting the semiconductor substrate 2 or the semiconductor substrate 3. The cameras 8 are fixed to the chamber. The camera 8 generates an image of a part of the semiconductor substrate 2 or a part of the semiconductor substrate 3, based on the reflected light transmitting through the lens 7.

Alignment marks and patterns are formed on the surfaces of the semiconductor substrates 2 and 3. The alignment marks are used to align the semiconductor substrates 2 and 3 in order to secure precision at the time of bonding of the semiconductor substrates 2 and 3. For example, the precision of the room-temperature bonding is in order of several μm, and the size of the alignment mark is several tens of μm order. The patterns indicate portions to be formed as a semiconductor device when the semiconductor substrates 2 and 3 are bonded through room-temperature bonding.

Figure 2:
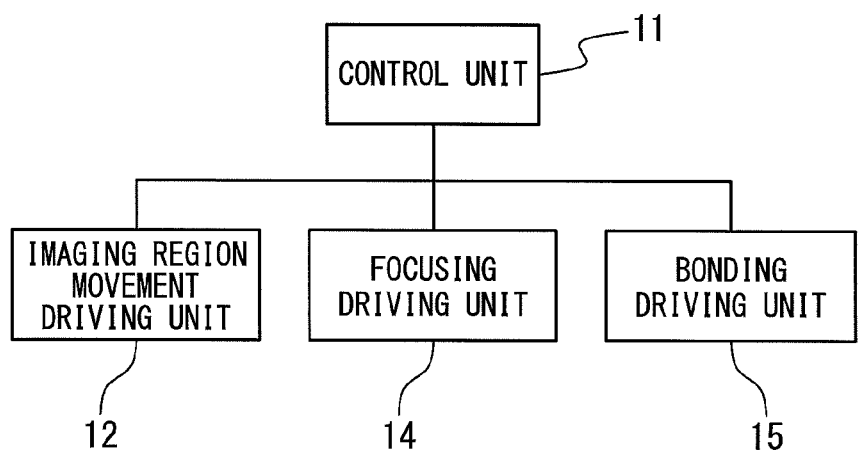
FIG. 2 is a block diagram showing a configuration of a room-temperature bonding apparatus.

As shown in FIG. 2, the room-temperature bonding apparatus further includes a control unit 11, an imaging region movement driving unit 12, a focusing driving unit 14, and a bonding driving unit 15. The control unit 11 is a computer, and includes a CPU, a storage unit, an input unit, a display unit, and an interface (all not shown). The CPU executes a computer program installed in the control unit 11, and controls the storage unit, the input unit, the output unit, and the interface. The storage unit stores the computer program, and stores data generated by the CPU. The input unit outputs to the CPU, data generated through an operation by a user. The input unit is exemplified by a keyboard and a mouse. The display unit displays an image generated by the CPU. The interface outputs to the CPU, data generated by an external unit connected to the control unit 11, and outputs data generated by the CPU to the external unit. The external unit includes the cameras 8, the imaging region movement driving unit 12, the focusing driving unit 14, and the bonding driving unit 15.

The imaging region movement driving unit 12 is controlled by the control unit 11 to drive the wafer moving stage 5 to move a substrate supported by the wafer moving stage 5 in parallel to a horizontal direction or rotate around a rotation axis parallel to a vertical axis. The focusing driving unit 14 is controlled by the control unit 11 to drive the focusing stages 6 to move the lenses 7 in parallel to the vertical axis. The bonding driving unit 15 is controlled by the control unit 11 to drive the upper stage 4 to move a substrate supported by the upper stage 4 in parallel to the vertical axis.

The room-temperature bonding apparatus further includes a load lock chamber and a carrying unit (both not shown). The load lock chamber is a container for sealing the inside of the chamber from the environment, and is controlled by the control unit 11 to generate a vacuum atmosphere or an atmosphere of atmospheric pressure in the chamber. When the vacuum atmosphere is generated in the load lock chamber, the carrying unit is controlled by the control unit 11 to carry the semiconductor substrate arranged in the load lock chamber, to the wafer moving stage 5, or carry the semiconductor substrate held by the wafer moving stage 5 to the load lock chamber. That is to say, the load lock chamber and the carrying unit are used to carry the semiconductor substrates into or from the chamber of the alignment unit 1.

The room-temperature bonding apparatus further includes an ion gun (not shown). The ion gun is arranged in the chamber of the alignment unit 1, and is controlled by the control unit 11 to irradiate charged particles. In consequence of irradiation of the charged particles to the semiconductor substrate, oxide formed on the surface of the semiconductor substrate is removed and impurities on the surface are removed, thereby cleaning the surface. The semiconductor substrates are bonded through room-temperature bonding by making such cleaned surfaces contact with each other.

Figure 3:
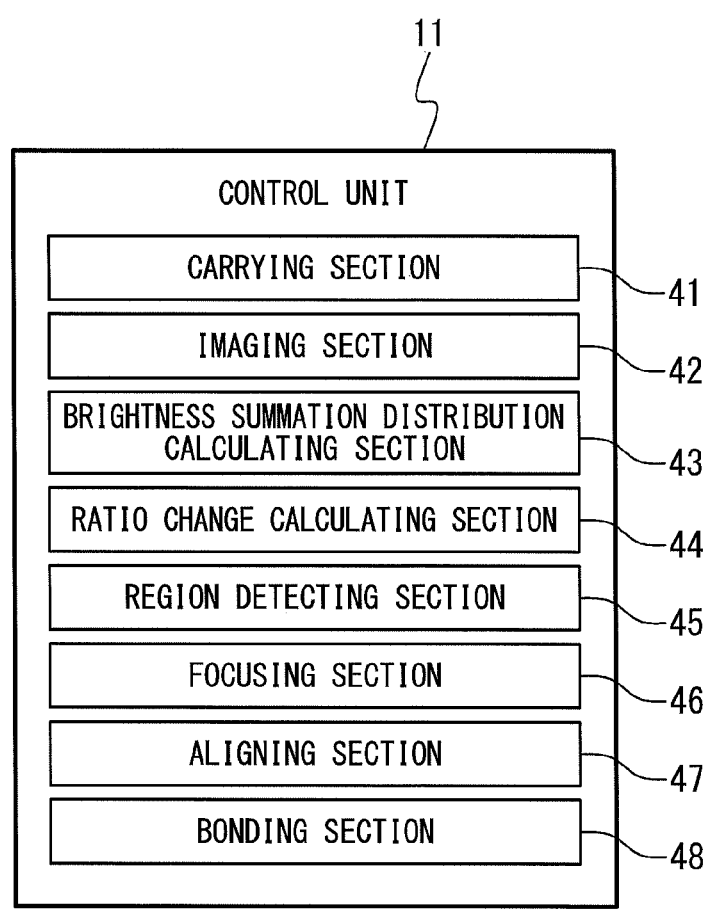
FIG. 3 is a block diagram showing a control apparatus.

As shown in FIG. 3, the computer program installed in the control unit 11 realizes a carrying section 41, an imaging section 42, an brightness summation distribution calculating section 43, a ratio change calculating section 44, a region detecting section 45, a focusing section 46, an aligning section 47, and a bonding section 48.

After a semiconductor substrate is located in the load lock chamber, the carrying section 41 carries the semiconductor substrate from the load lock chamber to the wafer moving stage 5 by using a carrying mechanism so that an alignment mark of the semiconductor substrate is located in the transparent portion 9. Then, the wafer moving stage 5 holds the semiconductor substrate. After room-temperature bonding, the control unit 11 controls the bonding driving unit 15 to move the upper stage 4 upwardly along the vertical axis, and carries a resultant semiconductor substrate as the result of room-temperature bonding from the wafer moving stage 5 to the load lock chamber by using the carrying mechanism.

The imaging section 42 controls the imaging region movement driving unit 12 to drive the wafer moving stage 5 to arrange a plurality of imaging regions of the surface of the semiconductor substrate held by the wafer moving stage 5 in fields of view of the cameras 8 in predetermined order. The imaging section 42 controls the cameras 8 to image the plurality of imaging regions of the semiconductor substrate.

The brightness summation distribution calculating section 43 calculates a brightness summation distribution based on the images obtained by the imaging section 42. The ratio change calculating section 44 calculates a ratio change based on two of the brightness summation distributions calculated by the brightness summation distribution calculating section 43. The region detecting section 45 detects the image showing an alignment mark from the images obtained by the imaging section 42 based on the ratio change calculated by the ratio change calculating section 44, and selects the imaging region corresponding to the detected image from the plurality of imaging regions.

The focusing section 46 controls the imaging region movement driving unit 12 to drive the wafer moving stage 5 such that the imaging region selected by the region detecting section 45 is imaged by the cameras 8. At this time, the focusing section 46 calculates a position of the lens 7 so that the camera 8 is focused on the imaging region. Then, the focusing section 46 controls the focusing driving unit 14 to drive the focusing stage 6 so that the lens 7 is positioned at the calculated position.

After the position of the lens 7 is adjusted by the focusing section 46, the aligning section 47 controls the imaging region movement driving unit 12 to drive the wafer moving stage 5 so that the alignment mark formed on the semiconductor substrate is shown at a predetermined position and the imaging region selected by the region detecting section 45 is imaged by the camera 8.

When the semiconductor substrate 2 and the semiconductor substrate 3 are located apart from each other, the bonding section 48 controls an ion gun to irradiate charged particles to the semiconductor substrate 3 and the semiconductor substrate 2. The bonding section 48 controls the bonding driving unit 15 to move the upper stage 4 downwardly along the vertical axis so that the upper stage 4 and the wafer moving stage 5 are brought close to each other up to a predetermined distance, and controls the imaging region movement driving unit 12 to drive the wafer moving stage 5 to perform precise alignment. After the precise alignment, the bonding section 48 controls the bonding driving unit 15 to move the upper stage 4 downwardly along the vertical axis so that the semiconductor substrate 2 and the semiconductor substrate 3 come into contact with each other.

Figure 4:
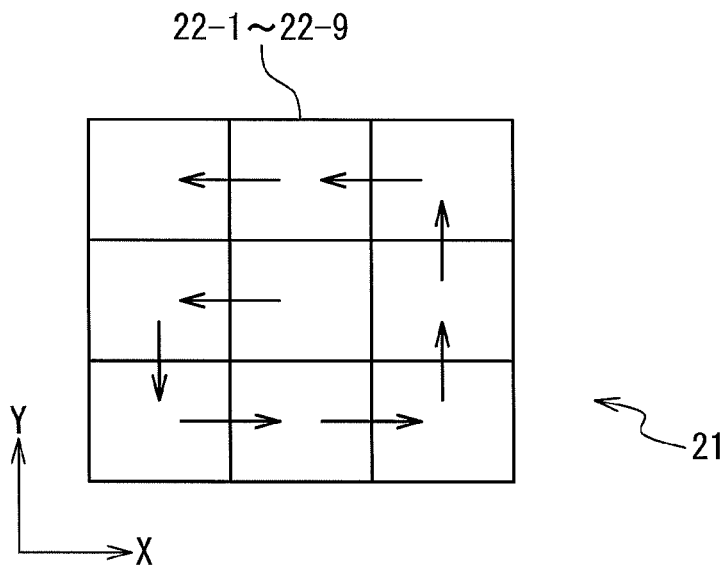
FIG. 4 is a diagram showing a part of a surface of a semiconductor substrate.

FIG. 4 shows regions of the surface of the semiconductor substrate 2 corresponding to the transparent portions 9, namely, the regions of the surface of the semiconductor substrate 2 which are imaged by the cameras 8. The regions 21 include a plurality of imaging regions 22-1 to 22-9. The imaging regions 22-1 to 22-9 are the regions imaged by the cameras 8 one time by one time, respectively. The drawing shows an example in which the imaging regions 22-1 to 22-9 are arranged in a matrix form in the x-axis direction and the y-axis direction so as not to overlap each other. Sequence numbers indicating an order are assigned to the imaging regions 22-1 to 22-9.

For example, the sequence numbers are assigned to the imaging regions 22-1 to 22-9 so that a path which follows the imaging regions in the order forms a counterclockwise spiral. That is to say, the number "1" is assigned to a first imaging region arranged at the center of the region 21 among the imaging regions 22-1 to 22-9. The number "2" is assigned to a second imaging region that is adjacent to the first imaging region in a direction opposite to the x-axis direction. The number "3" is assigned to a third imaging region that is adjacent to the second imaging region in a direction opposite to the y-axis direction.

The number "k+2" (k is a natural number) is assigned to the imaging region that is adjacent to the $(k+1)^{th}$ imaging region in the y-axis direction when the $(k+1)^{th}$ imaging region is adjacent to the $k^{th}$ imaging region in the x-axis direction and when any number is not assigned to the imaging region that is adjacent to the $(k+1)^{th}$ imaging region in the y-axis direction.

The number "k+2" is assigned to the imaging region that is adjacent to the $(k+1)^{th}$ imaging region in the x-axis direction when the $(k+1)^{th}$ imaging region is adjacent to the $k^{th}$ imaging region in the x-axis direction and when a number is assigned to the imaging region that is adjacent to the $(k+1)^{th}$ imaging region in the y-axis direction.

The number "k+2" is assigned to the imaging region that is adjacent to the $(k+1)^{th}$ imaging region in the direction opposite to the y-axis direction when the $(k+1)^{th}$ imaging region is adjacent to the $k^{th}$ imaging region in the direction opposite to the x-axis direction and when any number is not assigned to the imaging region that is adjacent to the $(k+1)^{th}$ imaging region in the direction opposite to the y-axis direction.

The number "k+2" is assigned to the imaging region that is adjacent to the $(k+1)^{th}$ imaging region in the direction opposite to the x-axis direction both when the $(k+1)^{th}$ imaging region is adjacent to the $k^{th}$ imaging region in the direction opposite to the x-axis direction and when a number is assigned to the imaging region that is adjacent to the $(k+1)^{th}$ imaging region in a direction opposite to the y-axis direction.

The number "k+2" is assigned to the imaging region that is adjacent to the (k+1)th imaging region in the direction opposite to the x-axis direction both when the $(k+1)^{th}$ imaging region is adjacent to the $k^{th}$ imaging region in the y-axis direction and when any number is not assigned to the imaging region that is adjacent to the $(k+1)^{th}$ imaging region in the direction opposite to the x-axis direction.

The number "k+2" is assigned to the imaging region that is adjacent to the $(k+1)^{th}$ imaging region in the y-axis direction both when the $(k+1)^{th}$ imaging region is adjacent to the $k^{th}$ imaging region in the y-axis direction and when a number is assigned to the imaging region that is adjacent to the $(k+1)^{th}$ imaging region in the direction opposite to the x-axis direction.

The number "k+2" is assigned to the imaging region that is adjacent to the $(k+1)^{th}$ imaging region in the x-axis direction both when the (k+1)th imaging region is adjacent to the $k^{th}$ imaging region in the direction opposite to the y-axis direction and when any number is not assigned to the imaging region that is adjacent to the $(k+1)^{th}$ imaging region in the x-axis direction.

The number "k+2" is assigned to the imaging region that is adjacent to the $(k+1)^{th}$ imaging region in the direction opposite to the y-axis direction both when the $(k+1)^{th}$ imaging region is adjacent to the $k^{th}$ imaging region in the direction opposite to the y-axis direction and when a number is assigned to the imaging region that is adjacent to the $(k+1)^{th}$ imaging region in the x-axis direction.

Figure 5:
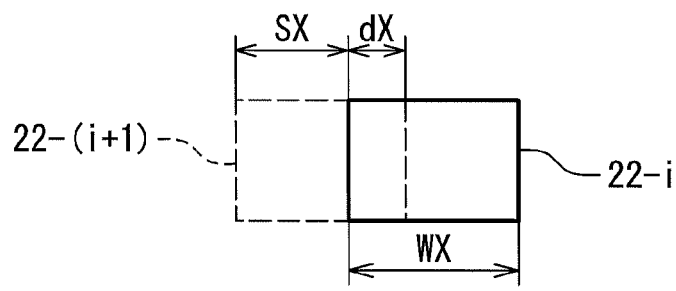
FIG. 5 is a plan view showing two imaging regions which are adjacent to each other in an x-axis direction.

FIG. 5 shows two imaging regions adjacent to each other in the x-axis direction. The positions of an imaging region 22-$i$ ($i$ is a natural number) and imaging region 22-($i$+1) in the y-axis direction are the same. The positions of the imaging region 22-$i$ and the imaging region 22-($i$+1) in the x-axis direction are different but partly overlap each other. The width of the overlapped portion in the x-axis direction (hereinafter, to be referred to as an "overlap amount in the x-axis direction") is larger than a half of the width of the alignment mark on the semiconductor substrate. At this time, when the imaging region 22-($i$+1) is imaged immediately after the imaging region 22-$i$ is imaged, the wafer moving stage 5 moves in a direction parallel to the x-axis direction by a step movement amount SX expressed by the following equation using the width of an imaging region in the x-axis direction WX and the overlap amount in the x-axis direction dX:

$$SX = WX - dX$$

Figure 6:
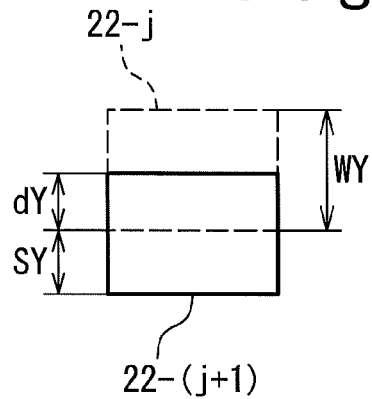
FIG. 6 is a plan view showing two imaging regions which are adjacent to each other in a y-axis direction.

FIG. 6 shows two imaging regions adjacent to each other in the y-axis direction. The positions of an imaging region 22-$j$ ($j$ is a natural number) and imaging region 22-($j$+1) in the x-axis direction are the same. The positions of the imaging region 22-$j$ and the imaging region 22-($j$+1) in the y-axis direction are different but partly overlap each other. The width of the lapped portion in the y-axis direction (hereinafter, to be referred to as an "overlap amount in the y-axis direction") is larger than the half of the width in the y-axis direction of an alignment mark on the semiconductor substrate. At this time, when the imaging region 22-($j$+1) is imaged immediately after the imaging region 22-$j$ is imaged, the wafer moving stage 5 moves in a direction parallel to the y-axis direction by a step movement amount SY expressed by the following equation using the width of the imaging region in the y-axis direction WY and the overlap amount in the y-axis direction dY:

$$SY = WY - dY$$

When the overlap amount in the x-axis direction or the overlap amount in the y-axis direction is 0, there is a case that more than a half of the alignment mark is not shown on an image. At this time, there is a risk that the control unit 11 cannot detect the alignment mark shown on the image. By arranging the imaging regions 22-1 to 22-9 in the above way, more than a half of the alignment mark can be imaged more surely. Therefore, the control unit 11 can more surely detect the alignment mark shown on the image. It should be noted that the alignment mark can be designed so that sizes in the x-axis direction and the y-axis direction are the same. At this time, a user can equally set the overlap amount in the x-axis direction and the overlap amount in the y-axis direction.

Figure 7:
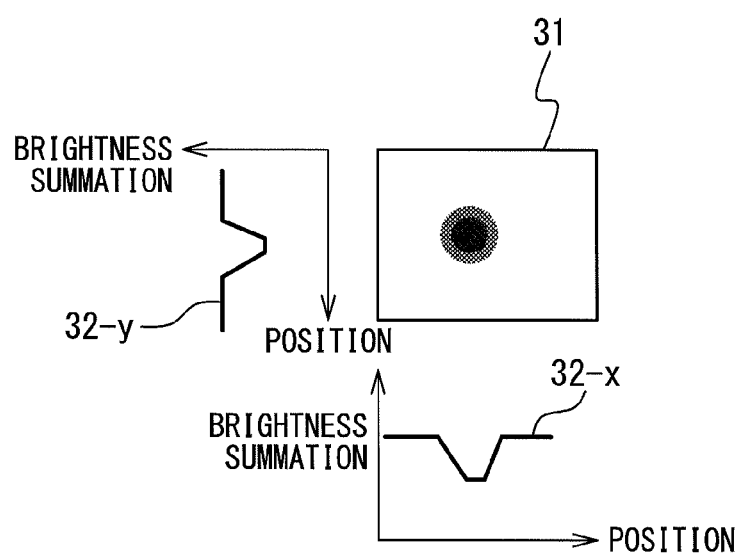
FIG. 7 is a diagram showing an image and brightness summation distributions.

FIG. 7 shows an image obtained by the imaging section 42 by using the camera 8. In an image 31, a plurality of colors correspond to a plurality of pixels. The plurality of pixels are arranged in a matrix in the x-direction and the y-axis direction, and are unit elements included in the image 31 and are identified from each other based on positions in the x-axis direction and positions in the y-axis direction. The colors show colors displayed by the corresponding pixels and show gradations which indicate degrees of black or white. A gradation shows a greater value as a color is darker.

FIG. 7 further shows a brightness summation distribution calculated by the brightness summation distribution calculating section 43. The brightness summation distribution includes a brightness summation distribution in the x-axis direction 32-x and a brightness summation distribution in the y-axis direction 32-y. The brightness summation distribution in the x-axis direction 32-x shows a distribution of brightness summations obtained when the image 31 is projected in the y-axis direction. That is to say, the brightness summation distribution in the x-axis direction 32-x shows a distribution of brightness summations in the x-axis direction to positions of the image 31 in the x-axis direction. The brightness summation in the x-axis direction that corresponds to a certain position in the x-axis direction shows a summation of gradations shown by the plurality of pixels corresponding to the position. The brightness summation distribution in the y-axis direction 32-y shows a distribution of brightness summation obtained when the image 31 is projected in the x-axis direction. That is to say, the brightness summation distribution in the y-axis direction 32-y shows a distribution of brightness summation in the y-axis direction for positions of the image 31 in the y-axis direction. The brightness summation in the y-axis direction corresponding to a certain position in the y-axis direction shows a total summation of gradations shown by the plurality of pixels corresponding to the position.

Figure 8:
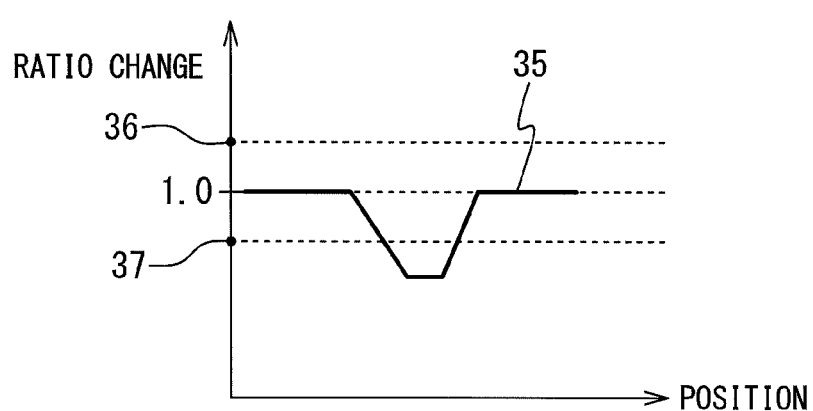
FIG. 8 is a graph showing a ratio change.

FIG. 8 shows a ratio change calculated by the ratio change calculating section 44. A ratio change 35 shows a change of ratios with respect to positions in the x-axis direction of the image 31. That is to say, the ratio at a certain position in the x-axis direction shows a quotient as the result of dividing the brightness summation at the position, of the brightness summation distribution in the x-axis direction 32-x calculated from a current image, by an brightness summation at the position, among the brightness summation distribution in the x-axis direction 32-x calculated from an immediately previous image.

At this time, the region detecting section 45 stores in the storage unit, a predetermined range inputted from the input unit by a user. The range is calculated through experiments, and shows a lower limit value 37 and an upper limit value 36.

When the ratio change 35 shows a value which is out of the range, the region detecting section 45 determines two brightness summation distributions in the x-axis direction used when the ratio change 35 is calculated. The region detecting section 45 determines the brightness summation distribution in the x-axis direction with a larger concavity amount from the two brightness summation distributions in the x-axis direction. The concavity amount shows an absolute value of a difference between a value at a plateau portion in the brightness summation distribution in the x-axis direction and a minimum value at a portion formed in a concavity in the brightness summation distribution in the x-axis direction, or shows an absolute value of a difference between a value at the plateau portion in an brightness summation distribution in the x-axis direction and a maximum value at a portion formed in a convexity in the brightness summation distribution in the x-axis direction. The region detecting section 45 determines an image used when the brightness summation distribution in the x-axis direction is calculated and calculates an imaging region shown by the image.

The region detecting section 45 performs the same calculation for the y-axis direction and calculates a single imaging region. That is to say, the ratio change calculating section 44 further calculates a ratio change showing a change of a ratio with respect to position in the y-axis direction of the image 31. That is to say, a ratio at a certain position in the y-axis direction shows a quotient as the result of dividing a brightness summation at the position among the brightness summation distribution in the y-axis direction 32-y calculated from a current image, by a brightness summation at the position among the brightness summation distribution in the y-axis direction 32-y calculated from an immediately previous image. When the ratio change 35 shows a value which is out of the range, the region detecting section 45 determines two brightness summation distributions in the y-axis direction used when the ratio change 35 is calculated, and determines the brightness summation distribution in the y-axis direction with a larger concavity amount from the two brightness summation distributions in the y-axis direction in order to calculate the imaging region for the brightness summation distribution in the y-axis direction to be calculated.

It should be noted that a color image is also applicable as an image obtained by the camera 8. At this time, a plurality of pixels included in the image show red gradations, blue gradations, and green gradations. Each of the gradations shows a larger value as a color is darker. At this time, a brightness summation in the x-axis direction at a certain position in the x-axis direction shows a total of red gradations, blue gradations, and green gradations shown by the plurality of pixels at the position, and the brightness summation in the y-axis direction at the certain position in the y-axis direction shows the total of red gradations, blue gradations, and green gradations shown by the plurality of pixels at the position.

Figure 9:
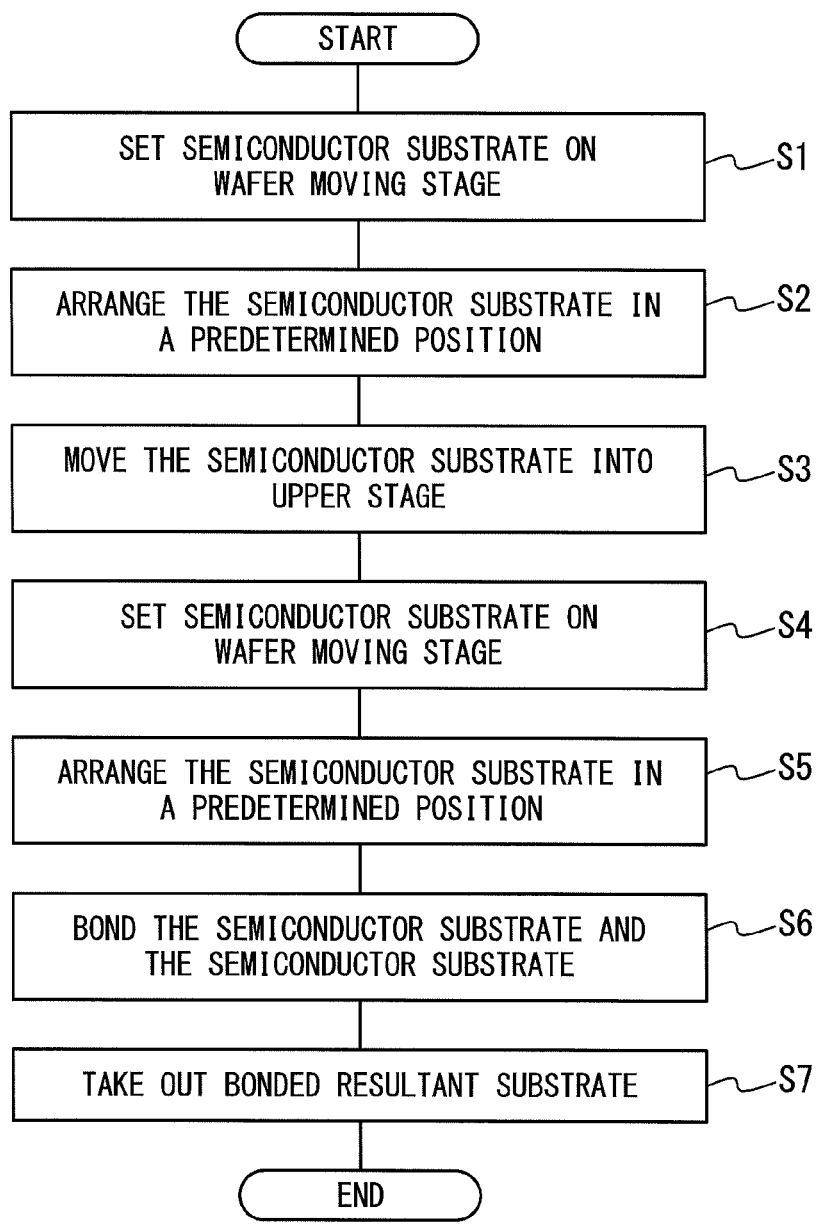
FIG. 9 is a flow chart showing a room-temperature bonding method.

FIG. 9 shows a room-temperature bonding method, to which the alignment method is applied, according to an embodiment of the present invention. The room-temperature bonding method is performed by using the following room-temperature bonding apparatus. A manufacturer firstly manufactures the semiconductor substrate 2 and the semiconductor substrate 3 and locates the semiconductor substrate 2 and the semiconductor substrate 3 in the load lock chamber. The control unit 11 carries the semiconductor substrate 2 from the load lock chamber to the wafer moving stage 5 by using the carrying mechanism so that a portion of an alignment mark on the semiconductor substrate 2 is arranged in the transparent portion 9, and holds the semiconductor substrate 2 on the wafer moving stage 5 (step S1). The control unit 11 controls the imaging region movement driving unit 12 to drive the wafer moving stage 5 to move the semiconductor substrate 2 in a predetermined position based on an image obtained by the camera 8 (step S2).

The control unit 11 controls the bonding driving unit 15 to move the upper stage 4 downwardly, and the upper stage 4 to hold the semiconductor substrate 2 held by the wafer moving stage 5 in order to move the upper stage 4 upwardly and hold the semiconductor substrate 2 in a location apart from the wafer moving stage 5 (step S3).

The control unit 11 carries the semiconductor substrate 3 from the load lock chamber to the wafer moving stage 5 by using the carrying mechanism so that a portion of an alignment mark on the semiconductor substrate 3 is arranged in the transparent portion 9, and holds the semiconductor substrate 3 on the wafer moving stage 5 (step S4). The control unit 11 controls the imaging region movement driving unit 12 to drive the wafer moving stage 5 to move the semiconductor substrate 3 in a predetermined position based on an image obtained by the cameras 8 (step S5).

In a state that the semiconductor substrate 2 and the semiconductor substrate 3 are apart from each other, the control unit 11 controls the ion gun to irradiate charged particles to the semiconductor substrate 3 and the semiconductor substrate 2. In consequence of the irradiation of charged particles to the semiconductor substrates 3 and 2, oxide films generated on the surfaces are removed and impurities on the surfaces are removed. The control unit 11 controls the bonding driving unit 15 to move the upper stage 4 downwardly along the vertical axis in order to bring the upper stage 4 and the wafer moving stage 5 close to each other up to a predetermined distance, and performs more precise alignment. After performing the precise alignment, the control unit 11 controls the bonding driving unit 15 to move the upper stage 4 downwardly along the vertical axis, so that the semiconductor substrate 2 and the semiconductor substrate 3 come into contact with each other (step S6). By coming into contact with each other in the above way, the semiconductor substrate 2 and the semiconductor substrate 3 are firmly bonded into a single substrate through room-temperature bonding. After the room-temperature bonding, the control unit 11 controls the bonding driving unit 15 to move the upper stage 4 upwardly along the vertical axis, and carries the resultant substrate of room-temperature bonding from the wafer moving stage 5 to the load lock chamber by using the carrying mechanism (step S7).

Figure 10:
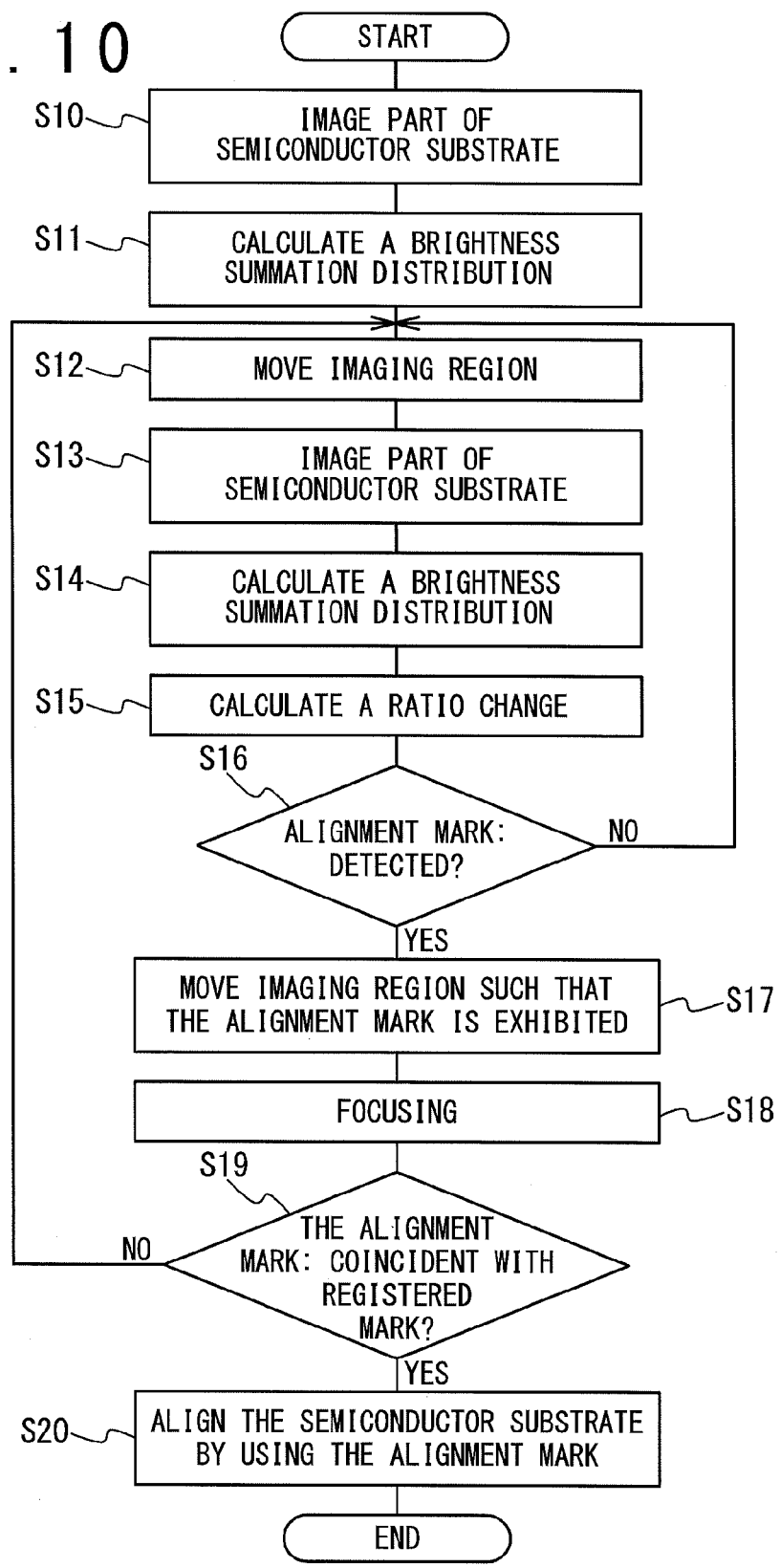
FIG. 10 is a flow chart showing an alignment method according to the embodiment of the present invention.

FIG. 10 shows the operations of the step S2 and the step S5 in detail. The control unit 11 firstly images a part of the semiconductor substrate held by the wafer moving stage 5 by using the camera 8 (step S10). The control unit 11 calculates a brightness summation distribution based on the image (step S11). The control unit 11 controls the imaging region movement driving unit 12 to drive the wafer moving stage 5 so that a path which follows the imaging regions in order of imaging forms a spiral (step S12). The control unit 11 again images a part of the semiconductor substrate held by the wafer moving stage 5 by using the camera 8 (step S13), and calculates a brightness summation distribution based on the image (step S14).

The control unit 11 calculates a ratio change based on the current brightness summation distribution and the immediately previous brightness summation distribution (step S15). The control unit 11 determines whether the alignment mark is formed in either of the two imaging regions, based on the ratio change (step S16). That is to say, the control unit 11 determines that the alignment mark is formed in one of the two imaging regions when the ratio change has a value which is out of a predetermined range, and determines that the alignment mark is not formed in either of the two imaging regions when the ratio change does not have a value which is out of the predetermined range. The control unit 11 repeatedly performs the operations of the steps S12 to S16 until determining that the alignment mark is shown.

When the alignment mark is determined to be shown (YES in the step S16), the control unit 11 controls the imaging region movement driving unit 12 to drive the wafer moving stage 5 so that the imaging region on which the alignment mark is exhibited, is imaged (step S17). The control unit 11 controls the camera 8 to image the semiconductor substrate after driving the wafer moving stage 5, and controls the focusing driving unit 14 to perform focusing based on a processing result of the image (step S18). The control unit 11 controls the camera 8 to image an image in focus.

The control unit 11 compares the alignment mark shown on the image in focus, and the initially-inputted alignment mark (step S19). The control unit 11 repeatedly performs the operations of the steps S12 to S19 until an alignment mark shown on the image in focus, and the initially-inputted alignment mark are coincident with each other.

When the alignment marks shown on the image in focus and the initially-inputted alignment mark are coincident with each other (YES in the step S19), the control unit 11 controls the imaging region movement driving unit 12 to drive the wafer moving stage 5 so that the alignment mark is shown in a predetermined position of the image (step S20).

The semiconductor substrate is required such that the alignment mark on the surface should be positioned in the field of vision of the camera 8 at the time of alignment for room-temperature bonding. As a technique to position the alignment mark in the field of vision of the camera 8, a technique in which a low magnification lens is used, a technique in which a zoom lens is used, and a technique in which a high-precision carrier device is used, are known, for example. In the technique in which the low magnification lens is used, it is necessary to prepare a high magnification optical system and another low magnification optical system for alignment, and to make optical axes of the two optical systems coincident with each other. In the technique in which a zoom lens is used, it is necessary to make optical axes at the time of use of the zoom lens at low magnification and high magnification respectively, coincident with each other. In the technique in which a high-precision carrier device is used, a larger-scale carrier mechanism is required as compared with a lower-precision carrier mechanism.

According to the alignment method of the present invention, it is possible to align the alignment mark of the semiconductor substrate in the field of vision of the camera 8 by using a single optical system. Therefore, according to the alignment method of the present invention, the alignment unit 1 needs to have neither another low magnification lens nor zoom lens for aligning alignment marks in the fields of vision of the cameras 8, making it possible to manufacture the alignment unit 1 of a smaller scale more easily.

According to the alignment method of the present invention, it is possible to drive the wafer moving stage 5 so that an alignment mark is positioned within the field of vision of the camera 8 when the alignment mark is outside the field of vision of the camera 8. For this reason, the alignment unit 1 does not need to have a high-precision carrier mechanism, and the smaller-scale alignment unit 1 can be manufactured by applying a lower-precision carrier mechanism.

The semiconductor substrates incorporated in the semiconductor device after the room-temperature bonding, have nothing around the alignment mark formed on the surface. In general, it is difficult for an optical system to focus on the semiconductor substrate when nothing is formed on the surface of the semiconductor substrate. According to the alignment method of the present invention, accurate focusing is not necessary and a region where the alignment mark is present, can be detected more easily since two images are compared to determine whether the alignment mark is present in either of the two imaging regions.

According to the alignment method of the present invention, the comparison of two images is performed by using the brightness summation distributions and performed by using a ratio change. For this reason, the comparison can be performed faster with a smaller amount of calculation. As a result, the alignment unit 1 can detect a region where the alignment mark is present, faster and productivity and performance of the bonding process can be improved. In addition, the alignment unit 1 can align the semiconductor substrates faster and reduce any contamination on the bonding surface of the semiconductor substrates, improving precision of room-temperature bonding.

According to the alignment method of the present invention, two imaging regions are compared by using both of the brightness summation distribution in the x-axis direction 32-$x$ and the brightness summation distribution in the y-axis direction 32-$y$. When the two imaging regions are compared by using only one of the brightness summation distributions in the x-axis direction 32-$x$ and the brightness summation distribution in the y-axis direction 32-$y$, it can be determined that no alignment mark is shown on the two imaging regions when a part of the alignment mark is shown on the two imaging regions. On the other hand, according to the alignment method of the present invention, it is possible to more surely detect two imaging regions in which the alignment mark is shown, compared with a case where the two imaging regions are compared by using a brightness summation distribution projected in a single direction.

According to the alignment method of the present invention, it is also possible to detect the brightness summation distribution corresponding to a region where the alignment mark has been formed, by comparing two brightness summation distributions without using ratio change. The comparison is exemplified by a method in which a difference between the two brightness summation distributions is used. At this time, in the alignment method of the present invention, it is possible to more easily manufacture the smaller-scale alignment unit 1 and more easily detect a region where the alignment mark is present, in the same way as the case where ratio change is used.

According to the alignment method of the present invention, it is also possible to detect an image corresponding to a region where the alignment mark is formed, by comparing two images without using the brightness summation distribution. The comparison is exemplified by a method in which a difference between the two brightness summation distributions is used. At this time, in the alignment method of the present invention, it is possible to more easily manufacture the smaller-scale alignment unit 1 and more easily detect a region where the alignment mark is present, in the same way as the case where a brightness summation distribution is used.

In addition, it is also possible that an order of imaging when a plurality of imaging regions are imaged is determined so that a path which follows the imaging regions in that order, forms a shape different from a spiral. The order is required to meet that each of the imaging regions should be imaged at least one time, and an order which forms a clockwise spiral and an order arranged in lines are exemplified. At this time, the alignment method of the present invention makes it possible to more easily manufacture the smaller-scale alignment unit 1 and more easily detect a region where an alignment mark is present, in the same way as the case where order that forms a spiral is applied.

The invention claimed is:

1. An alignment unit control apparatus comprising:
  an imaging section configured to control cameras to image a plurality of regions on a surface of a substrate to generate a plurality of images;
  a region detecting section configured to select a detection region from the plurality of regions based on the plurality of images;
  an aligning section configured to align the substrate based on an alignment image obtained by imaging a mark of said substrate in the detection region by one of said plurality of cameras; and
  a brightness summation distribution calculating section configured to calculate a plurality of brightness summation distributions based on the plurality of images,
  wherein when a first image of the plurality of images and a second image of the plurality of images are different from each other, said region detecting section selects said detection region from a first region shown by the first image and a second region shown by the second image,
  wherein one of the plurality of brightness summation distributions calculated based on a one of the plurality of images shows a distribution of brightness summations obtained when the image is projected in a projection direction,
  wherein said region detecting section selects the detection region from the first region and the second region when a first brightness summation distribution calculated based on the first image among the plurality of brightness summation distributions and a second brightness summation distribution calculated based on the second image among the plurality of brightness summation distributions are different from each other,
  wherein the alignment unit control apparatus further comprises:
  a ratio change calculating section configured to calculate a ratio change based on the first brightness summation distribution and the second brightness summation distribution,
  wherein the ratio change at each of positions shows a ratio as a result of dividing a brightness summation at each of positions of the first brightness summation distribution by a brightness summation at the position of the second brightness summation distribution, and
  wherein when the ratio change has a value which is out of a predetermined range, said region detecting section selects the detection region from the first region and the second region.

2. The alignment unit control apparatus according to claim 1, wherein the brightness summation distribution further shows another distribution of brightness summations in which the image is projected in another projection direction different from the projection direction.

3. The alignment unit control apparatus according to claim 2, further comprising:
  a ratio change calculating section configured to calculate a first ratio change and a second ratio change based on the first brightness summation distribution and the second brightness summation distribution,
  wherein the first ratio change shows a ratio change as a result of dividing a brightness summation at each of positions of a brightness summation distribution obtained through projection in said projection direction of the first brightness summation distribution, by a brightness summation at the position of a brightness summation distribution obtained through projection in said projection direction of the second brightness summation distribution, wherein the second ratio change shows a ratio change as a result of dividing a brightness summation at each of positions of a brightness summation distribution obtained through projection in said another projection direction of the first brightness summation distribution, by a brightness summation at the position of a brightness summation distribution obtained through projection in said another projection direction of the second brightness summation distribution, and wherein when the first ratio change or the second ratio change has a value which is out of a predetermined range, said region detecting section selects the detection region from the first region and the second region.

4. The alignment unit control apparatus according to claim 1, further comprising:
a focusing section configured to control said camera to performing a focusing operation based on the image of the detection region.

5. The alignment unit control apparatus according to claim 4, wherein when the alignment image of the mark is different from a predetermined image, said region detecting section selects another detection region different from the detection region, from the plurality of regions based on the plurality of images, and
wherein said aligning section aligns the substrate based on the alignment image of the mark shown in said another detection region.

6. The alignment unit control apparatus according to claim 1, wherein a path which follows the plurality of regions in order of imaging of the plurality of regions, forms a spiral.

7. The alignment unit control apparatus according to claim 1, wherein a width of an overlapping region of two adjacent to each other in one direction among the plurality of regions is larger than a half of a width of the mark of said substrate in the one direction.

8. An alignment method comprising:
imaging a plurality of regions of a surface of a substrate by cameras to generate a plurality of images;
selecting a detection region from the plurality of regions based on the plurality of images;
aligning the substrate based on an alignment image of a mark of the substrate in the detection region imaged by one of said plurality of cameras; and
calculating a plurality of brightness summation distributions based on the plurality of images;
wherein when a first image of the plurality of images and a second image of the plurality of images are different from each other, said detection region is selected from a first region shown by the first image and a second region shown by the second image,
wherein one of the plurality of brightness summation distributions calculated based on a one of the plurality of images shows a distribution of brightness summations obtained when the image is projected in a projection direction,
wherein the detection region is selected from the first region and the second region when a first brightness summation distribution calculated based on the first image among the plurality of brightness summation distributions and a second brightness summation distribution calculated based on the second image among the plurality of brightness summation distributions are different from each other, wherein the alignment method further comprises:
calculating a ratio change based on the first brightness summation distribution and the second brightness summation distribution,
wherein the ratio change at each of positions shows a ratio as a result of dividing a brightness summation at the position of the first brightness summation distribution by a brightness summation at the position of the second brightness summation distribution, and
wherein when the ratio change has a value which is out of a predetermined range, the detection region is selected from the first region and the second region.

9. The alignment method according to claim 8, wherein the brightness summation distribution further shows another distribution of brightness summations in which the image is projected in another projection direction different from the projection direction.

10. The alignment method according to claim 9, further comprising:
calculating a first ratio change and a second ratio change based on the first brightness summation distribution and the second brightness summation distribution,
wherein the first ratio change shows a ratio change as a result of dividing a brightness summation at each of positions of a brightness summation distribution obtained through projection in said projection direction of the first brightness summation distribution, by a brightness summation at the position of a brightness summation distribution obtained through projection in said projection direction of the second brightness summation distribution,
wherein the second ratio change shows a ratio change as a result of dividing a brightness summation at each of positions of a brightness summation distribution obtained through projection in said another projection direction of the first brightness summation distribution, by a brightness summation at the position of a brightness summation distribution obtained through projection in said another projection direction of the second brightness summation distribution, and
wherein when the first ratio change or the second ratio change has a value which is out of a predetermined range, the detection region is selected from the first region and the second region.

11. The alignment method according to claim 8, further comprising:
imaging an alignment image after focusing said camera based on the image the detection region.

12. The alignment method according to claim 11, further comprising:
selecting another detection region different from the detection region, from the plurality of regions based on the plurality of images when the alignment image of the mark is different from a predetermined image; and
aligning the substrate based on the alignment image of the mark in said another detection region.

13. The alignment method according to claim 8, wherein a path which follows the plurality of regions in order of imaging of the plurality of regions, forms a spiral.

14. The alignment method according to claim 8, wherein a width of an overlapping region of two adjacent to each other in one direction among the plurality of regions is larger than a half of a width of the mark of said substrate in the one direction.

* * * * *